US009076522B2

(12) United States Patent
You et al.

(10) Patent No.: US 9,076,522 B2
(45) Date of Patent: Jul. 7, 2015

(54) MEMORY CELLS BREAKDOWN PROTECTION

(71) Applicant: TAIWAN SEMICONDUCTOR MANUFACTURING CO., LTD., Hsinchu (TW)

(72) Inventors: Wen-Chun You, Yilan County (TW); Kuo-Chi Tu, Hsin-Chu (TW); Chih-Yang Chang, Changhua County (TW); Hsia-Wei Chen, Taipei (TW); Yu-Wen Liao, New Taipei (TW); Chin-Chieh Yang, New Taipei (TW); Sheng-Hung Shih, Hsinchu (TW); Wen-Ting Chu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/041,916

(22) Filed: Sep. 30, 2013

(65) Prior Publication Data

US 2015/0092471 A1    Apr. 2, 2015

(51) Int. Cl.
*G11C 11/00* (2006.01)
*G11C 13/00* (2006.01)

(52) U.S. Cl.
CPC .......... *G11C 13/003* (2013.01); *G11C 13/0097* (2013.01)

(58) Field of Classification Search
CPC .................................................. G11C 13/0097
USPC ........................................................ 365/148
See application file for complete search history.

(56) References Cited

U.S. PATENT DOCUMENTS

| 6,849,891 | B1 | 2/2005 | Hsu et al. |
| 7,057,922 | B2* | 6/2006 | Fukumoto ..................... 365/158 |
| 7,407,858 | B2 | 8/2008 | Li et al. |
| 7,511,986 | B2* | 3/2009 | Horii et al. ..................... 365/148 |
| 7,539,040 | B2* | 5/2009 | Tamai et al. ................... 365/148 |
| 7,795,606 | B2 | 9/2010 | Jin et al. |
| 8,000,128 | B2 | 8/2011 | Li et al. |
| 8,009,454 | B2 | 8/2011 | Lee et al. |
| 2004/0036109 | A1* | 2/2004 | Inoue et al. .................... 257/314 |
| 2013/0242640 | A1* | 9/2013 | Haukness et al. ............. 365/148 |
| 2014/0254237 | A1* | 9/2014 | Chang et al. ................... 365/148 |

* cited by examiner

*Primary Examiner* — Son Mai
(74) *Attorney, Agent, or Firm* — McDermott Will & Emery LLP (57) ABSTRACT

A method is disclosed that includes the operations outlined below. A first voltage is applied to a gate of an access transistor of each of a row of memory cells during a reset operation, wherein a first source/drain of the access transistor is electrically connected to a first electrode of a resistive random access memory (RRAM) device in the same memory cell. An inhibition voltage is applied to a second electrode of the RRAM device or to a second source/drain of the access transistor of each of a plurality of unselected memory cells when the first voltage is applied to the gate of the access transistor.

19 Claims, 6 Drawing Sheets

MEMORY CELLS BREAKDOWN PROTECTION

BACKGROUND

ITRS (International Technology Roadmap for Semiconductors) anticipates that NAND flash may not scale in below 20 nanometer process technology due to degradation in performance and reliability characteristics. Resistive random access memory (RRAM, or ReRAM) is one of the most notable candidates to replace flash memory.

BRIEF DESCRIPTION OF THE DRAWINGS

The disclosure can be more fully understood by reading the following detailed description of various embodiments, with reference to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
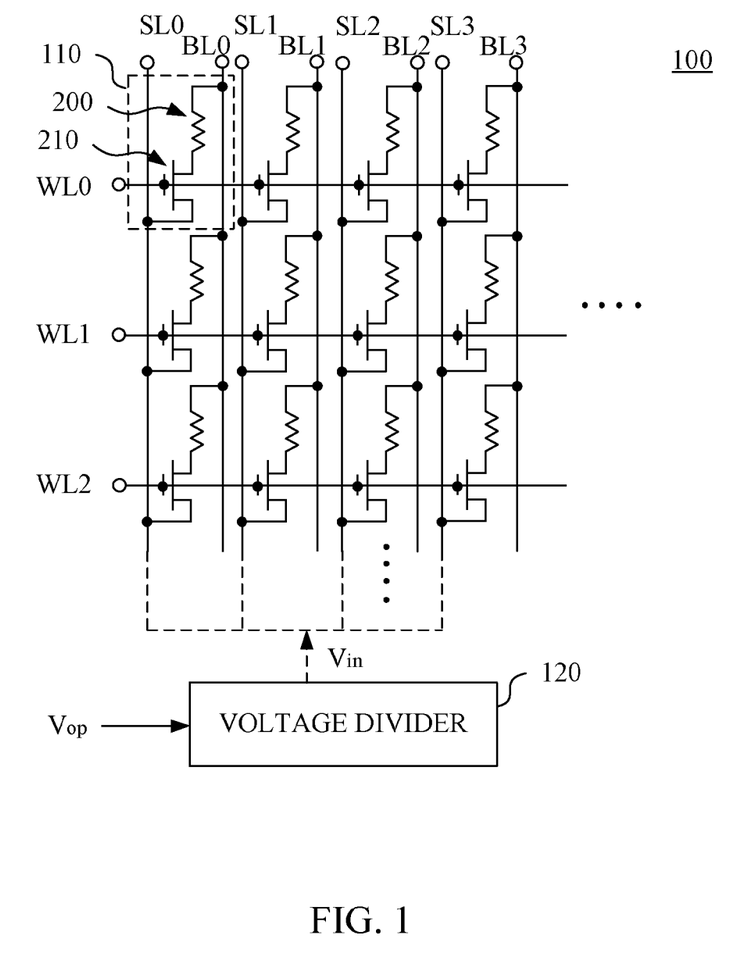
FIG. 1 is a schematic diagram of a memory array in accordance with various embodiments of the present disclosure.
Figure 2:
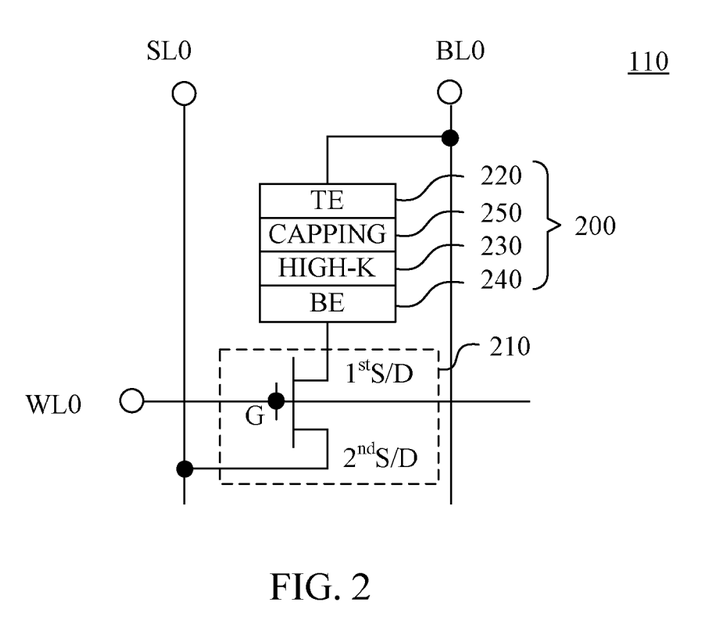
FIG. 2 is a schematic diagram of one memory cell in the memory array in accordance with various embodiments of the present disclosure.

FIG. 1 is a schematic diagram of a memory array 100 in accordance with various embodiments of the present disclosure. FIG. 2 is a schematic diagram of one memory cell 110 in the memory array 100 in accordance with various embodiments of the present disclosure. The memory array 100 in FIG. 1 is described below together with the memory cell 110 in FIG. 2.

The memory array 100 includes a plurality of memory cells 110. For illustration, the memory cells 110 are disposed at intersections of the word lines WL0, WL1, WL2 and bit lines BL0, BL1, BL2, BL3 and BL4, respectively, in a matrix of rows and columns. Each of the memory cells 110 includes a resistive random access memory (RRAM) device 200 and an access transistor 210 that are electrically connected together.

A voltage divider 120 is electrically connected to the source lines SL0, SL1, SL2 and SL3. In some embodiments, the voltage divider 12 receives an operation voltage Vop to generate a divided voltage as an inhibition voltage Vin. The inhibition voltage Vin is selectively transmitted to the source lines SL0, SL1, SL2 and SL3. In some embodiments, the operation voltage Vop is a system operation voltage.

In some embodiments, as shown in FIG. 2, the RRAM device 200 includes a top electrode (TE) 220, a high-K dielectric layer 230, a bottom electrode (BE) 240 and a capping layer 250. The high-K dielectric layer 230 has a resistive switching property when different voltages are applied to the top electrode 220 and the bottom electrode 240. The capping layer 250 including material, such as titanium (Ti), is selectively disposed on the high-K dielectric layer 230.

The access transistor 210 includes a first source/drain, a second source/drain and a gate, which are illustratively labeled as $1^{st}$S/D, $2^{nd}$S/D and G in FIG. 2. In some embodiments, the first source/drain $1^{st}$S/D of the access transistor 210 is electrically connected to the bottom electrode 240 of the RRAM device 200.

Each of the word lines WL0-WL2 is electrically connected to a respective row of the memory cells 110. For illustration, each of the word lines WL0-WL2 is electrically connected to the gate of the access transistor 210 in each of the memory cells 110 in a single row.

Each of the bit lines BL0-BL3 is electrically connected to a respective column of the memory cells 110. For illustration, each of the bit lines BL0-BL3 is electrically connected to the top electrode 220 of the RRAM device 200 in each of the memory cells 110 in a single column.

For illustration, in FIG. 1, the source lines SL0-SL3 are disposed in the same direction as the bit lines BL0-BL3. Each of the source lines SL0-SL3 is electrically connected to a respective column of the memory cells 110. For illustration, each of the source lines SL0-SL3 is electrically connected to the second source/drain $2^{nd}$S/D of the access transistor 210 in each of the memory cells 110 in a single column.

Different operations of the memory cells, such as a forming operation, a set operation, a reset operation and a read operation, are performed with different applied voltages. During the different operations, different voltages are applied through the corresponding word line, the corresponding source line and the corresponding bit line, respectively, to the gate G of the access transistor 210, the second source/drain $2^{nd}$S/D of the access transistor 210 and the top electrode 220 of the RRAM device 200 in each of the memory cells 110.

Figure 3:
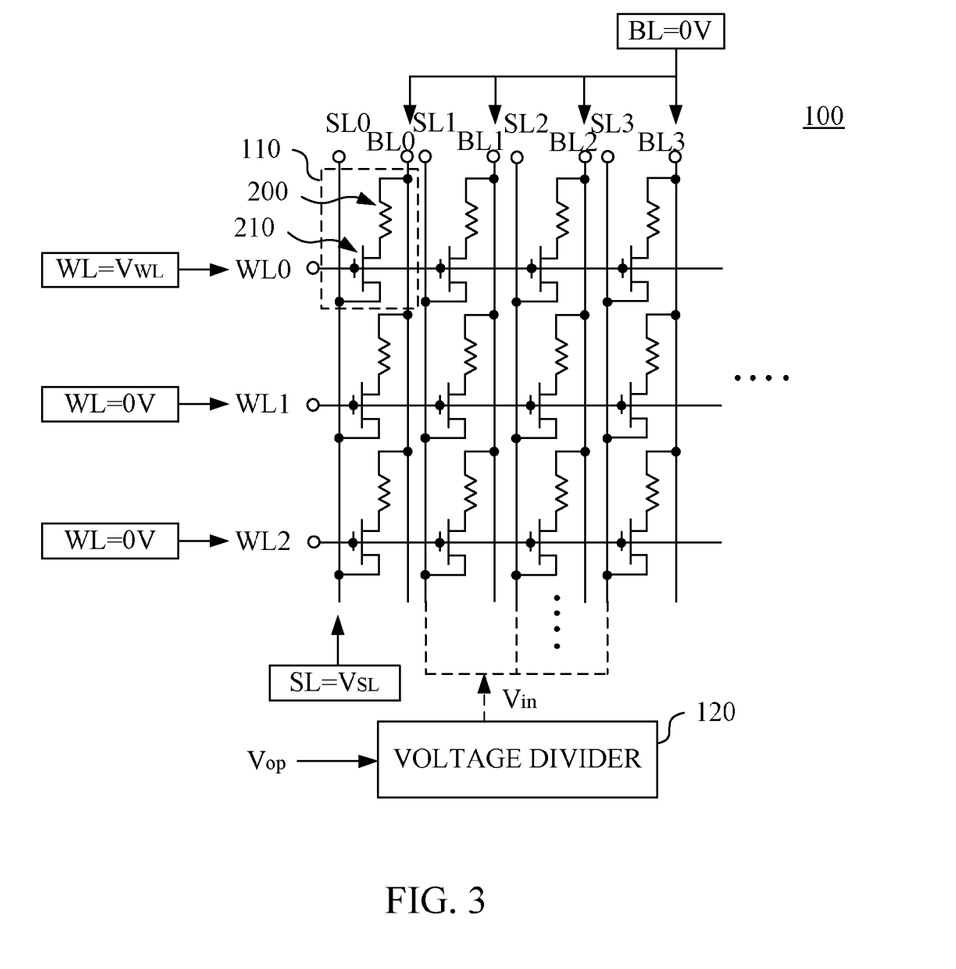
FIG. 3 is a schematic diagram illustrating exemplary reset operations of the memory cells in the memory array during the reset operation in accordance with various embodiments of the present disclosure.

FIG. 3 is a schematic diagram illustrating exemplary reset operations of the memory cells 110 in the memory array 100 during the reset operation in accordance with various embodiments of the present disclosure.

Figure 4:
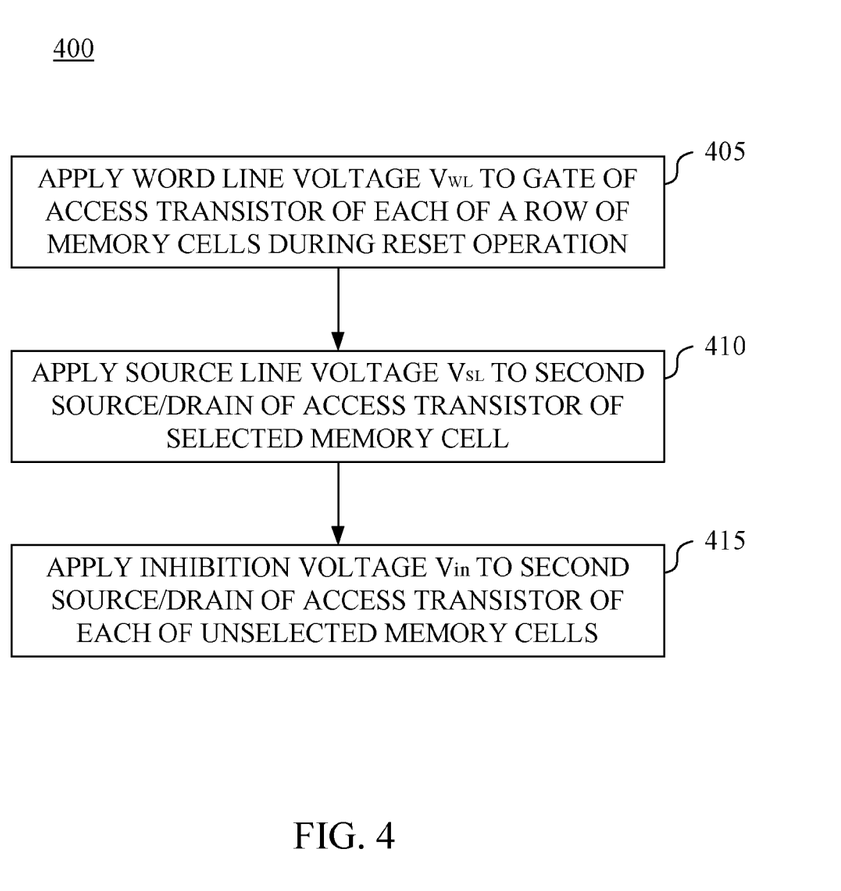
FIG. 4 is a flow chart of a method illustrating the reset operation of a single row of memory cells, in accordance with various embodiments of the present disclosure.

FIG. 4 is a flow chart of a method 300 illustrating the reset operation of a single row of memory cells 110 in FIG. 1, in accordance with various embodiments of the present disclosure. For illustration, the reset operation of a single row of memory cells 110 in FIG. 1 is described by the method 300 with reference to FIG. 3.

In operation 405, a word line voltage VWL on the word line WL0 is applied to the gate of the access transistor 210 in each of the memory cells 110 in the row corresponding to the word line WL0. When the word line voltage VWL on the word line WL0 is applied, the other word lines WL1 and WL2 apply substantially 0 Volts to the corresponding rows of memory cells such that the rows of memory cells 110 corresponding to the word lines WL1 and WL2 are not in the reset operation.

In operation 410, a source line voltage VSL is applied to the second source/drain $2^{nd}$S/D of the access transistor 210 of the memory cells 110 in the column corresponding to the source line SL0. Since only the word line WL0 receives the word line voltage VWL in step 405, only the memory cell 110 at the intersection of the word line WL0 and the source line SL0 is selected to perform the reset operation.

In operation 415, the voltage divider 120 generates the inhibition voltage Vin according to the operation voltage Vop, and applies the inhibition voltage Vin to the second source/drain $2^{nd}$S/D of the access transistor 210 in each of the unselected memory cells through the corresponding source lines SL1-SL3 during the reset operation.

For a numerical example, the word line voltage VWL is substantially 2 Volts, the source line voltage VSL is substantially 1.8 Volts, and the operation voltage Vop is substantially 1.1 Volts (e.g., ±10%). In some embodiments, the voltage applied by the bit lines BL0-BL3 is substantially 0 Volts.

In some embodiments, the inhibition voltage Vin is larger than about 0.1 Volts. In some other embodiments, the inhibition voltage Vin ranges from about 0.1 Volts to about 0.6 Volts.

Since the word line WL0 applies a high word line voltage VWL to all the memory cells 110 in the corresponding row during the reset operation, the access transistor 210 of each of the unselected memory cells 110 suffers from dielectric breakdown risk if the voltage difference between the second source/drain $2^{nd}$S/D and the gate G of the access transistor 210 is too large. Therefore, in some embodiments, the inhibition voltage Vin is applied to prevent the occurrence of the breakdown of the access transistor 210.

Effectively, the inhibition voltage Vin is applied such that the difference between the word line voltage VWL and the inhibition voltage Vin is smaller than a breakdown voltage of the access transistor 210 to provide breakdown protection for the access transistor 210. Further, the inhibition voltage Vin is smaller than the source line voltage VSL to keep the unselected memory cells in the unselected state.

Due to the presence of the inhibition voltage Vin at the second source/drain of the access transistor 210, the voltage difference between the gate and the second source/drain of the access transistor 210 (i.e., Vgs) is lowered. In the example described above, if the word line voltage VWL applied to the gate of the access transistor 210 is 2 Volts, and the inhibition voltage Vin is 0.3 Volts, the voltage difference Vgs becomes 1.7 Volts. Hence, the risks of breakdown of the access transistor 210 can be reduced.

Based on the aforementioned operations of the memory cells 110 and the voltage divider 120, the voltage divider 120 provides the inhibition voltage Vin to the unselected memory cells 110 to provide breakdown protection. As a result, the breakdown damages cause by the high word line voltage VWL can be prevented.

In various embodiments, the voltage divider 120 is electrically connected to the bit lines B0-BL3 instead of the source lines SL0-SL3. For illustration, when the word line WL0 applies the word line voltage VWL and the source line SL0 applies the source line voltage VSL during the reset operation, the access transistor 210 at the intersection of the word line WL0 and the source line SL0 is selected. Each of the unselected memory cells corresponding to the source line SL1-SL3 suffers from dielectric breakdown risks if the voltage difference between the first source/drain $1^{st}$S/D and the gate G of the access transistor 210 is too large. Therefore, the voltage divider 120 applies the inhibition voltage Vin to the top electrode 220 of the RRAM device 200 of each of the unselected memory cells 110 through the bit lines BL1-BL3. The occurrence of the breakdown of the access transistor 210 is prevented.

Figure 5:
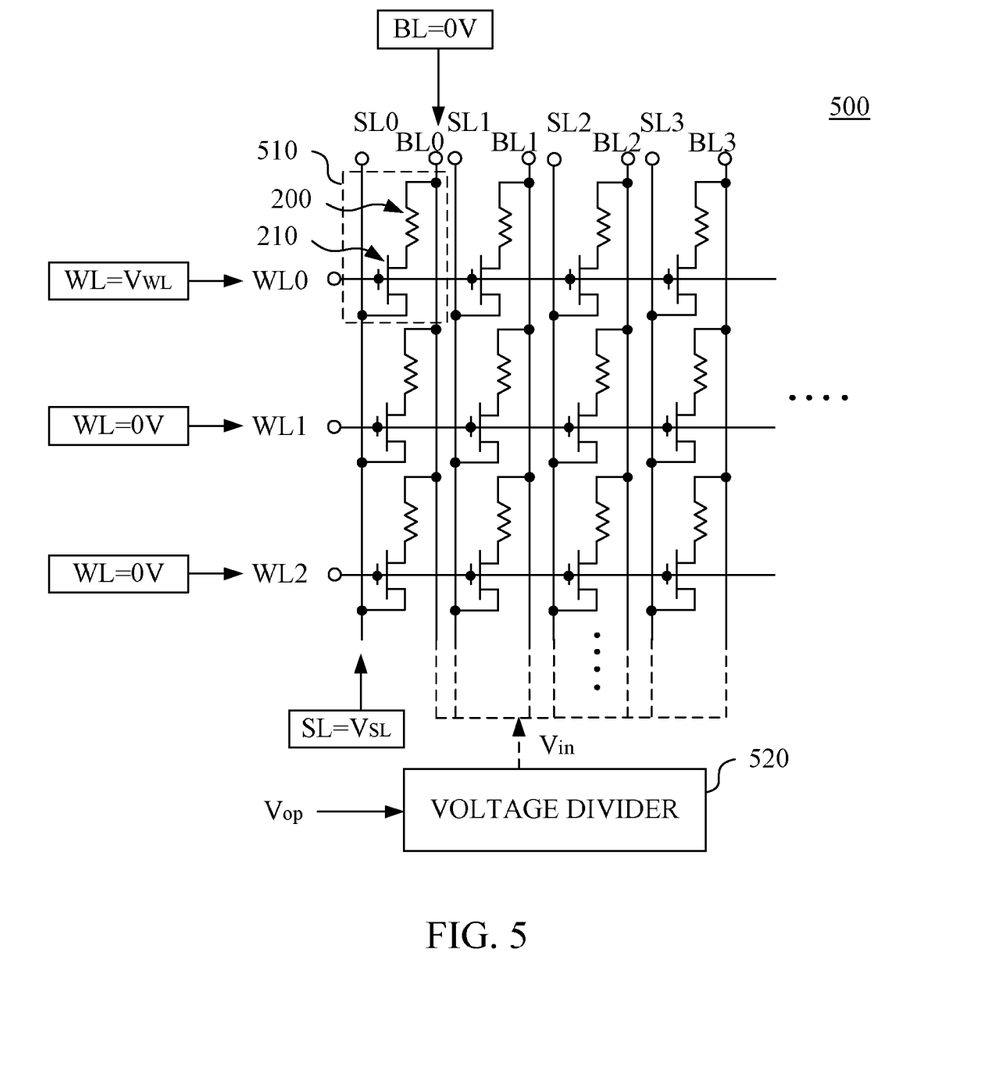
FIG. 5 is a schematic diagram illustrating exemplary reset operations of the memory cells in the memory array during the reset operation in accordance with various embodiments of the present disclosure.

FIG. 5 is a schematic diagram illustrating exemplary reset operations of the memory cells 510 in the memory array 500 during the reset operation in accordance with various embodiments of the present disclosure.

Figure 6:
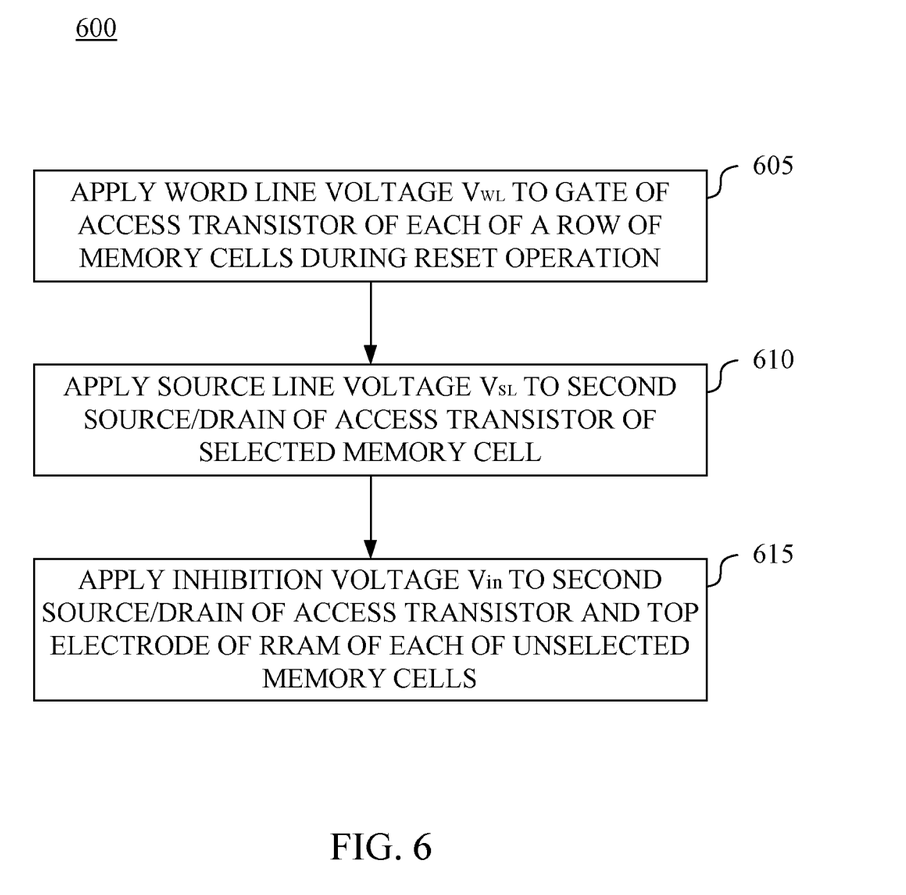
FIG. 6 is a flow chart of a method illustrating the reset operation of a single row of memory cells, in accordance with various embodiments of the present disclosure.

FIG. 6 is a flow chart of a method 600 illustrating the reset operation of a single row of memory cells, in accordance with some embodiments of the present disclosure. For illustration, the reset operation of a single row of memory cells is described by the method 600 together with FIG. 5.

Similar to the memory array 100 in FIG. 1, the memory array 500 includes a plurality of memory cells 510 disposed at the intersections of the word lines WL0-WL2 and bit lines BL0-BL4 to form a matrix of rows and columns. Each of the memory cells 510 has the same structure as the memory cell 110 depicted in FIG. 2. However, in some embodiments, the voltage divider 520 is electrically connected to the source lines SL0-SL3 and the bit lines BL0-BL3.

In operation 605, a word line voltage VWL on the word line WL0 is applied to the gate of the access transistor 210 in each of the memory cells 510 in the row corresponding to the word line WL0. When the word line voltage VWL on the word line WL0 is applied, the other word lines WL1 and WL2 apply substantially 0 Volts to the corresponding rows of memory cells such that the rows of memory cells 510 corresponding to the word lines WL1 and WL2 are not in the reset operation.

In operation 610, a source line voltage VSL is applied to the second source/drain $2^{nd}$S/D of the access transistor 210 of the memory cells 510 in the column corresponding to the source line SL0. Since only the word line WL0 receives the word line voltage VWL in step 605, only the memory cell 510 at the intersection of the word line WL0 and the source line SL0 is selected to perform the reset operation.

In operation 615, the voltage divider 520 generates the inhibition voltage Vin according to the operation voltage Vop, and applies the inhibition voltage Vin to the second source/drain $2^{nd}$S/D of the access transistor 210 in each of the unselected memory cells through the corresponding source lines SL1-SL3. The voltage divider 520 further applies the inhibition voltage Vin to the top electrode 220 of the RRAM device 200 in each of the unselected memory cells through the corresponding bit lines BL1-BL3.

In some embodiments, the original voltage applied to the selected memory cell 510 from the bit line BL0 is substantially 0 Volts during the reset operation. In order to prevent the selected memory cell 510 from the occurrence of dielectric breakdown, the voltage divider 520 is also configured to apply the inhibition voltage Vin to the selected memory cell 510 through the bit line BL0.

For a numerical example, the word line voltage VWL is 2 Volts and the source line voltage VSL is 1.8 Volts and the operation voltage Vop is 1.1 Volts (±10%).

In some embodiments, the inhibition voltage Vin is larger than about 0.1 Volts. In some other embodiments, the inhibition voltage Vin ranges from about 0.1 Volts to about 0.6 Volts.

Due to the presence of the inhibition voltage Vin at the second source/drain of the access transistor 210, the voltage difference between the gate G and the second source/drain $2^{nd}$S/D of the access transistor 210 is lower compared to other approaches. Further, the voltage difference between the gate G and the top electrode 220 of the RRAM device 200 is lower too. Hence, the risks of breakdown of the access transistor 210 can be reduced.

Based on the aforementioned operations of the memory cells 510 and the voltage divider 520, the voltage divider 520 provides the inhibition voltage Vin to the unselected memory cells 510 to provide breakdown protection. As a result, the breakdown damages cause by the high word line voltage VWL can be prevented.

In some embodiments, a method is disclosed that includes the operations outlined below. A first voltage is applied to a gate of an access transistor of each of a row of memory cells, wherein a first source/drain of the access transistor is electrically connected to a first electrode of a resistive random access memory (RRAM) device in the same memory cell. An inhibition voltage is applied to a second electrode of the RRAM device or to a second source/drain of the access transistor of each of the unselected memory cells when the first voltage is applied to the gate of the access transistor.

Also disclosed is a method that includes the operations outlined below. A first voltage is applied to a gate of an access transistor of each of a row of memory cells, wherein a first source/drain of the access transistor is electrically connected to a first electrode of a resistive random access memory (RRAM) device in the same memory cell. An inhibition voltage is applied to a second electrode of the RRAM device and to a second source/drain of the access transistor of each of the unselected memory cells when the first voltage is applied to the gate of the access transistor.

Also disclosed is a circuit that includes a row of memory cells and a voltage divider. Each of the memory cells includes a resistive random access memory (RRAM) device and an access transistor. The RRAM device includes a first electrode and a second electrode. The access transistor includes a gate to receive a first voltage during a reset operation, a first/source drain electrically connected to the first electrode of the RRAM device and a second source/drain. The voltage divider generates an inhibition voltage according to an operation voltage and applies the inhibition voltage on at least one of a second electrode of the RRAM device and a second source/drain of the access transistor of each of a plurality of unselected memory cells when the first voltage is applied to the gate of the access transistor.

In this document, the term "connected" may be termed as "electrically connected", and the term "coupled" may be termed as "electrically coupled". "Connected" and "coupled" may also be used to indicate that two or more elements cooperate or interact with each other.

The number of the memory cells, word lines, bit lines and source lines mentioned in this document are for illustrative purposes. Various numbers are within the contemplated scope of the present disclosure.

The values of the word line voltage VWL, the operation voltage Vop, the operation voltage Vop and the inhibition voltage Vin mentioned above are for illustrative purposes. Various other numbers are within the contemplated scope of the present disclosure.

The above illustrations include exemplary operations, but the operations are not necessarily performed in the order shown. Operations may be added, replaced, changed order, and/or eliminated as appropriate, in accordance with the spirit and scope of various embodiments of the present disclosure.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A method comprising:
    applying a first voltage to a gate of an access transistor of each of a row of memory cells during a reset operation, wherein a first source/drain of the access transistor is electrically connected to a first electrode of a resistive random access memory (RRAM) device in the same memory cell; and
    applying a non-zero inhibition voltage to a second electrode of the RRAM device or to a second source/drain of the access transistor of each of a plurality of unselected memory cells when the first voltage is applied to the gate of the access transistor.

2. The method of claim 1, further comprising:
    applying the first voltage from a word line electrically connected to the gate of the access transistor.

3. The method of claim 1, further comprising:
    applying the inhibition voltage from a bit line electrically connected to the second electrode of the RRAM device or from a source line electrically connected to the second source/drain of the access transistor.

4. The method of claim 1, further comprising:
    applying a second voltage higher than the inhibition voltage to the second source/drain of the access transistor of a selected memory cell through a corresponding source line.

5. The method of claim 1, wherein a difference between the first voltage and the inhibition voltage is smaller than a breakdown voltage of the access transistor.

6. The method of claim 1, wherein the inhibition voltage is in a range from about 0.1 Volts to about 0.6 Volts.

7. A method comprising:
    applying a first voltage to a gate of an access transistor of each of a row of memory cells, wherein a first source/drain of the access transistor is electrically connected to a first electrode of a resistive random access memory (RRAM) device in the same memory cell; and
    applying a non-zero inhibition voltage to a second electrode of the RRAM device and to a second source/drain of the access transistor of each of the unselected memory cells when the first voltage is applied to the gate of the access transistor.

8. The method of claim 7, further comprising:
applying the first voltage from a word line electrically connected to the gate of the access transistor.

9. The method of claim 7, further comprising:
applying the inhibition voltage from a bit line electrically connected to the second electrode of the RRAM device and from a source line electrically connected to the second source/drain of the access transistor.

10. The method of claim 7, further comprising:
selecting one of the memory cells by applying a second voltage higher than the inhibition voltage to the second source/drain of the access transistor of a selected memory cell through a corresponding source line.

11. The method of claim 7, wherein a difference between the first voltage and the inhibition voltage is smaller than a breakdown voltage of the access transistor.

12. The method of claim 1, wherein the inhibition voltage is in a range from about 0.1 Volts to about 0.6 Volts.

13. A circuit comprising:
a row of memory cells each comprising:
a resistive random access memory (RRAM) device comprising a first electrode and a second electrode; and
an access transistor comprising a gate to receive a first voltage during a reset operation, a first/source drain electrically connected to the first electrode of the RRAM device and a second source/drain;
a voltage divider configured to generate a non-zero inhibition voltage according to an operation voltage and apply the inhibition voltage to at least one of a second electrode of the RRAM device and a second source/drain of the access transistor of each of a plurality of unselected memory cells when the first voltage is applied to the gate of the access transistor.

14. The circuit of claim 13, further comprising a word line electrically connected to the gate of the access transistor of each of the memory cells to apply the first voltage thereto.

15. The circuit of claim 13, further comprising:
a plurality of bit lines electrically connected to the second electrode of the RRAM device of each of the memory cells; and
a plurality of source lines electrically connected to the second source/drain of the access transistor of each of the memory cells;
wherein the voltage divider applies the inhibition voltage to at least one of the second electrode of the RRAM device of each of the unselected memory cells through the bit lines and the second source/drain of the access transistor of each of the unselected memory cells through the source line.

16. The circuit of claim 13, wherein one of the memory cells is selected by applying a second voltage higher than the inhibition voltage to the second source/drain of the access transistor of the selected memory cell through one of a plurality of source lines.

17. The circuit of claim 13, wherein a difference between the first voltage and the inhibition voltage is smaller than a breakdown voltage of the access transistor.

18. The circuit of claim 13, wherein the voltage divider applies the inhibition voltage to both of the second electrode of the RRAM device and the second source/drain of the access transistor of each of a plurality of unselected memory cells when the first voltage is applied to the gate of the access transistor.

19. The circuit of claim 13, wherein the inhibition voltage is in a range from about 0.1 Volts to about 0.6 Volts.

* * * * *